United States Patent
Kobayashi et al.

[11] Patent Number: 5,297,712
[45] Date of Patent: Mar. 29, 1994

[54] SYSTEM FOR FEEDING AND POSITIONING ARTICLES BEING PROCESSED

[75] Inventors: Hiroaki Kobayashi, Yokohama; Masahito Nagaoka, Kawasaki, both of Japan

[73] Assignee: Kabushiki Kaisha Toshiba, Kawasaki, Japan

[21] Appl. No.: 912,131

[22] Filed: Jul. 9, 1992

Related U.S. Application Data

[63] Continuation of Ser. No. 617,946, Nov. 27, 1990, abandoned, which is a continuation of Ser. No. 252,922, Oct. 4, 1988, abandoned.

[30] Foreign Application Priority Data

Oct. 6, 1987 [JP] Japan .................. 62-252198

[51] Int. Cl.⁵ .................................... B65H 23/16
[52] U.S. Cl. .................................... 226/24; 226/27; 226/36; 226/43; 226/120
[58] Field of Search ................... 226/24–27, 226/36, 43, 45, 120, 136, 137

[56] References Cited

U.S. PATENT DOCUMENTS

| | | | |
|---|---|---|---|
| 3,603,728 | 9/1971 | Arimura | 178/6.8 |
| 3,762,125 | 10/1973 | Prena | 226/27 |
| 3,881,820 | 5/1975 | Muir | 226/33 X |
| 3,904,099 | 9/1975 | Inoue | 226/33 |
| 4,420,107 | 12/1983 | Seyffert et al. | 226/32 |
| 4,505,225 | 3/1985 | Husain | 118/669 |
| 4,552,608 | 11/1985 | Hoffman et al. | 226/28 X |
| 4,617,080 | 10/1986 | Kobayashi et al. | 226/27 X |
| 4,674,670 | 6/1987 | Watanabe et al. | 228/102 |
| 4,692,819 | 9/1981 | Steele | 226/27 X |
| 4,782,987 | 11/1988 | Giacomelli et al. | 226/27 X |

FOREIGN PATENT DOCUMENTS 60-80231 5/1985 Japan .
61-81634 4/1986 Japan .

*Primary Examiner*—Daniel P. Stodola
*Assistant Examiner*—Paul T. Bowen
*Attorney, Agent, or Firm*—Foley & Lardner

[57] ABSTRACT

A system for feeding and positioning articles being processed comprises: a conveying device for driving and conveying the articles; a passage detecting component for detecting the passage of a part to be detected of one part of an article, which is being thus conveyed and driven, past a forward mark point which has been set at a position spaced apart by a specific distance immediately in front of an ultimate objective stopping position; a position pulse counter for counting the timing of the passage of the part to be detected past the forward mark point; an additional feed quantity setting component for setting the quantity of feeding of an article up to the ultimate objective stopping position in accordance with the timing of passage of the part to be detected past the forward mark point; and a feed quantity control component for controlling the driving quantity of the conveying device in accordance with the said quantity feeding thus set.

6 Claims, 4 Drawing Sheets

SYSTEM FOR FEEDING AND POSITIONING ARTICLES BEING PROCESSED

This application is a continuation of application Ser. No. 07/617,946, filed Nov. 27, 1990, now abandoned, which is a continuation of application Ser. No. 07/252,922, filed Oct. 4, 1988, now abandoned.

BACKGROUND OF THE INVENTION

This invention relates generally to means for feeding and positioning articles undergoing processing relative to the means carrying out the processing. More particularly, the invention relates to a system for feeding and positioning articles which is designed to carry out with high precision positioning of articles such as lead frames in the fabrication and assembly of semiconductor devices.

In general, the process of assembling a semiconductor device comprises the steps of mounting a semiconductor chip on a lead frame, carrying out wire bonding with respect to this semiconductor chip thus mounted, and setting this semiconductor chip thus wire bonded in a metal mold. In carrying out these steps, a lead frame is fed along guide rails, and, at each work position, it is required that the lead frame be positioned and stopped accurately and positively.

In order to feed and position the lead frame, it has been the practice to form pilot holes at constant spacing intervals along a lateral side part of the lead frame in the longitudinal direction thereof and to cause a pilot pin to engage with each pilot hole thereby to achieve positioning.

In this known technique, however, pilot pins respectively suitable for a variety of lead frames of different frame widths and feed pitches become necessary, whereby the pilot pin must be changed for every frame, and assembly efficiency drops.

For this reason, we have proposed a system (as disclosed in Japanese Patent Application Laid-Open Publication No. 81634/1986) in which: a lead frame is moved through only a set distance; the actual lead frame feed quantity is detected at every completion of the movement; the (error) difference between this detected quantity and a specified lead frame feed quantity is measured by means such as an ITV camera; and the difference thus measured is used as feedback to correct the lead frame feed quantity of the succeeding feeding, whereby the necessity of using pilot pins is obviated.

In another prior-art technique (as disclosed in Japanese Patent Application Laid-Open Publication No. 80231/1985), positioning of a lead frame is accomplished by using an image sensor. More specifically, the positional difference or offset between the detection position and the center position of the island of the lead frame is detected by an image sensor, and the lead frame is moved by a distance corresponding to this positional offset thereby to accomplish correction.

However, in the above described positioning techniques in which pilot pins are unnecessary, it has been heretofore necessary to either use a pattern-recognition ITV camera having the object of pattern recognition of chip mounts, wire bonding, etc., or to use separate ITV cameras. In either case, time for pattern recognition becomes necessary and gives rise to a decrease in cycle time. Moreover, pattern recognition entails a program of relatively high level, the control of which occupies a large proportion thereof, whereby not only does a control system of extensive scale become necessary, but, for adaptability to a large variety of articles, a memory capacity for storing corresponding patterns becomes necessary. Furthermore, in pattern recognition, a pattern of a configuration which is appropriate for the lead frame is required, and its size must match the image size of the ITV camera.

In the above described example of the prior art, an X-Y table is caused to move, and an appropriate shape in the vicinity of the inner lead is made the objective. However, not only does a movement time become necessary, but the inner lead is readily deformed, whereby there arises the problem of uncertainty of reliability of this as a datum reference. While a pilot hole is suitable as a datum reference, it is accompanied by a number of problems such as the great length of the movement distance and the addition of the movement time. Furthermore, the size of a pilot hole is of the order of 1 to 2 mm and does not match the ITV camera in some cases, and, even if it does match, memory means for a great variety of patterns becomes necessary.

The use of separate ITV cameras for respectively exclusive use may appear to be feasible, but it has been accompanied in all instances by the problem of high costs and the problem of excessive installation space due to the positioning above of the head of the chip mounting mechanism and of the head of the wire bonding mechanism and other parts and to the positioning below of a wafer ring, heater, etc.

SUMMARY OF THE INVENTION

Accordingly, it is an object of this invention to provide a system for feeding and positioning articles undergoing processing in which the problems accompanying like systems in the prior art are solved, and, in the conveying and positioning of lead frames or other articles, this positioning can be carried out accurately, positively, and at high speed, and which is adaptable to various sizes and shapes of articles and contributes to low-cost fabrication of products.

According to this invention, briefly summarized, there is provided a system for feeding and positioning articles being processed comprising: a conveying device for driving and conveying said articles; a passage detecting component for detecting the passage of a part to be detected of one part of an article, which is being thus conveyed and driven, past a forward mark point which has been set at a position spaced apart by a specific distance immediately in front of an ultimate objective stopping position; a position pulse counter for counting the timing of the passage of said part to be detected past said forward mark point; an additional feed quantity setting component for setting the quantity of feeding of an article up to said ultimate objective stopping position in accordance with the timing of passage of said part to be detected past said forward mark point; and a feed quantity control component for controlling the driving quantity of said conveying device in accordance with said quantity of feeding thus set.

According to this invention, by counting by means of a counter the quantity of feeding of an article such as a lead frame prior to or after the timing at which a part to be detected of the article has passed by a passage detecting sensor of the detection component, setting by means of the feed quantity setting component the feed quantity of the article from this passage timing to the completion of conveying and driving and positioning of the article, and controlling by means of the feed quantity controlling component the conveying device for conveying and driving the article, the article feed quantity from the passage detecting component is continually controlled at a constant value thereby to carry out positioning.

According to this invention as summarized above, instead of using ITV cameras, an inexpensive optical sensor and a mechanical scanning means or the like are combined, and moreover, for this mechanical scanning means, the conveying of the article to be conveyed such as a lead frame, which is the original objective, is utilized. As a result, a performance as high as that resulting from the use of a line sensor can be attained, and there is provided a high-speed feeding and positioning system the control and mechanism of which are relatively simple and of low equipment cost.

According to this invention, moveover, the problem of articles such as lead frames of different characteristics such as size and shape is solved by the use of varying a few set data without increasing the memory capacity.

According to this invention, furthermore, in the case of lead frame, for example, there are deviations or irregularities such as dimensional errors and those in the pilot hole diameter and pilot hole position. However, since the center in the feeding direction which is not influenced by these deviations is determined, accurate and positive positioning can be achieved, and at the same time, since pilot holes, which undergo very little deformation due to external forces or heat as areas in the vicinity of the inner leads, are used as datum references, the reliability is also improved.

Since each article such as a lead frame is moved continually in the conveying direction, deleterious influences due to effects such as lost motion and backlash can be eliminated.

The nature, utility, and further features of this invention will be more clearly apparent from the following detailed description with respect to preferred embodiments of the invention when read in conjunction with the accompanying drawings, briefly described below.

DETAILED DESCRIPTION OF THE INVENTION

Figure 1:
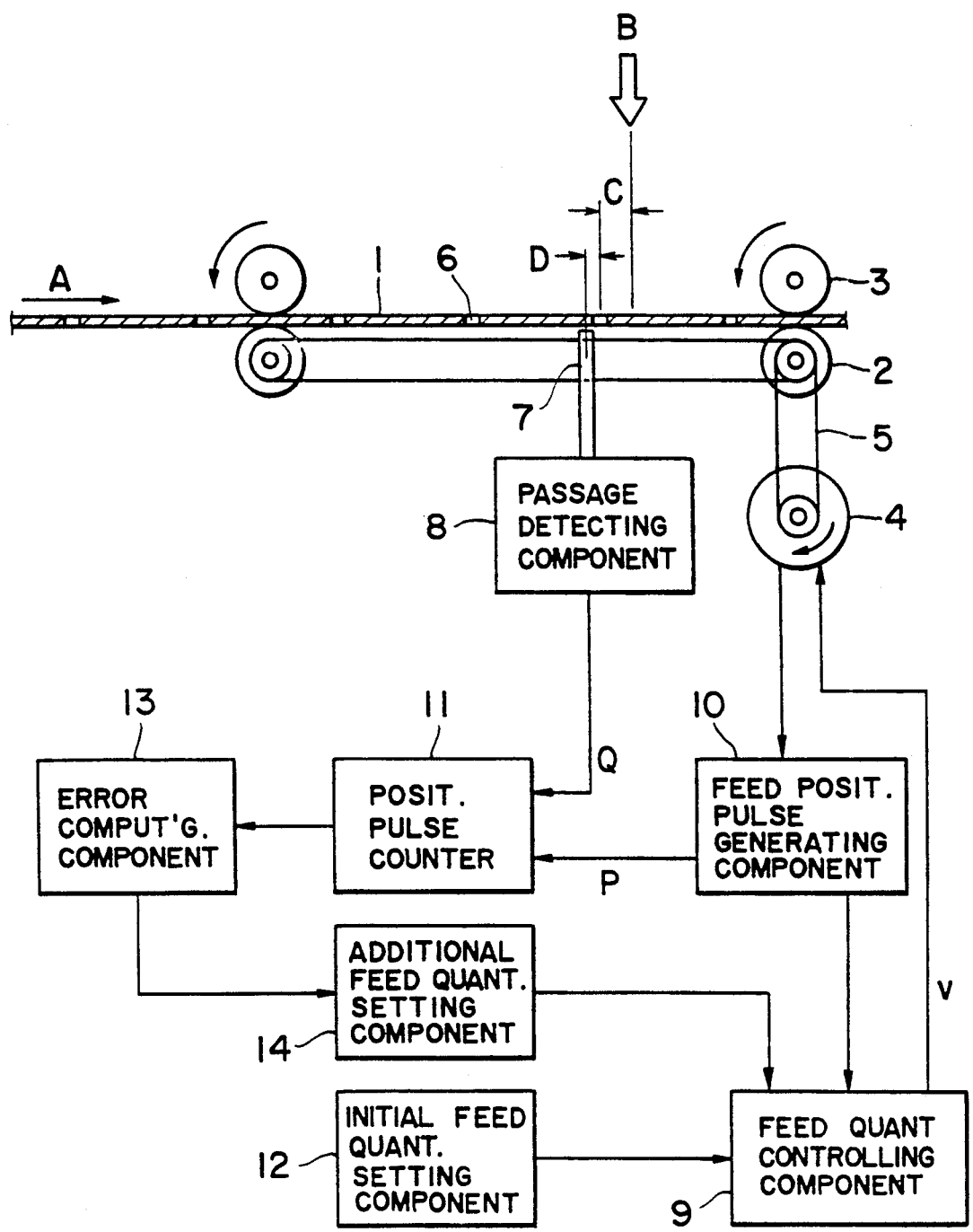
FIG. 1 is a combination of a schematic diagram, in side view, and a block diagram showing the essential parts and their organization of one example of the system for feeding and positioning articles according to this invention.
Figure 2:
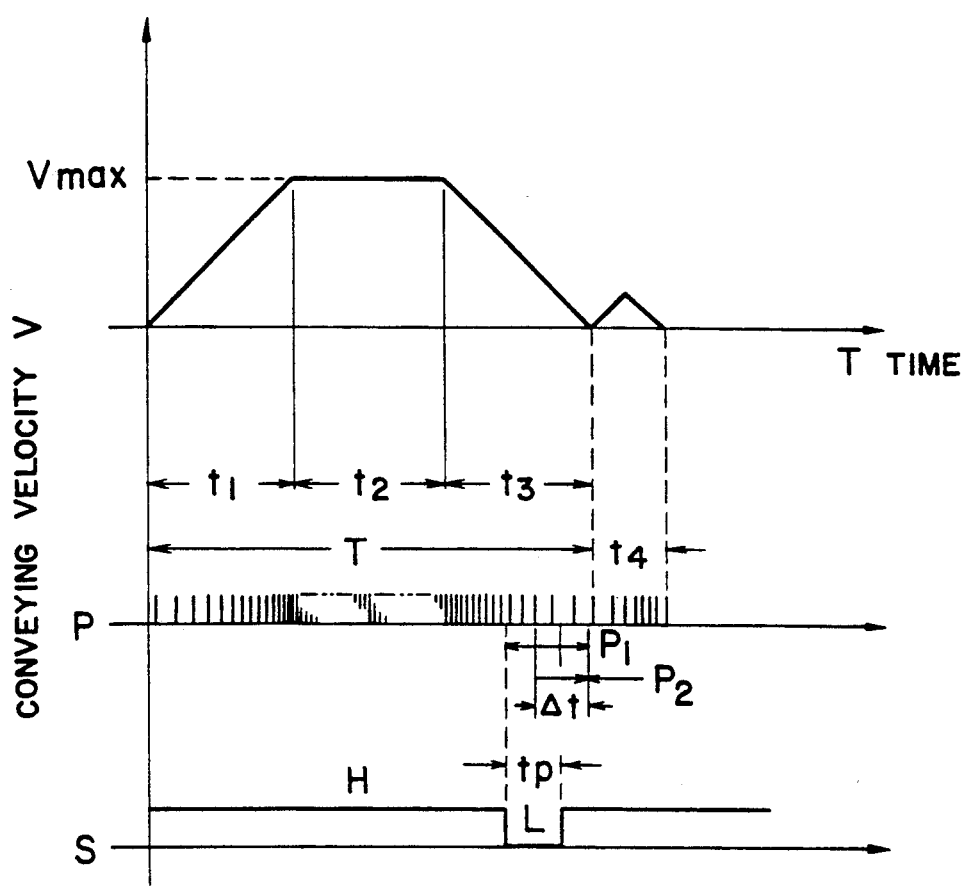
FIG. 2 is a time chart indicating one mode of practice of the system for feeding and positioning articles of the invention.

One example of application of the invention to the feeding and positioning of a lead frame is illustrated in FIG. 1, in which the lead frame 1, which is the article being conveyed, is movably clamped between a driving roller 2 and a pinch roller 3. The driving roller 2 is driven in rotation by a motive power motor 4 with an encoder by way of a timing belt 5. The rotary power output of the motor 4 is thus transmitted to cause the driving roller 2 to rotate and thereby to convey the lead frame 1 in the arrow direction A as indicated in FIG. 1.

Figure 3:
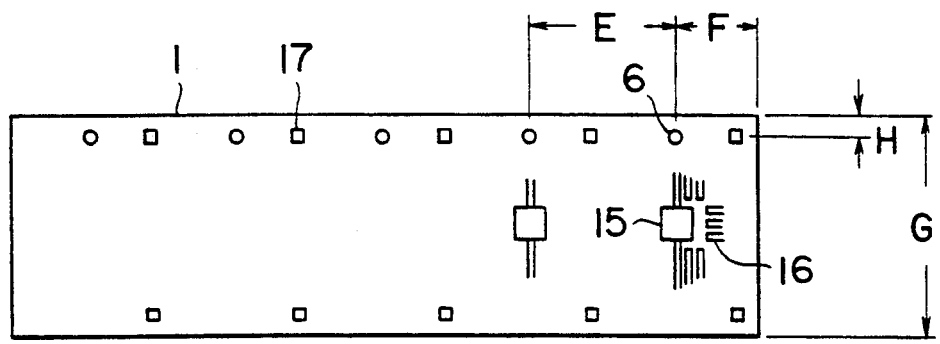
FIG. 3 is a plan view of one example of a lead frame of the invention.

Along a line parallel and close to one lateral edge of the lead frame 1, a row of pilot holes 6, 6, . . . are formed at a specific even spacing or pitch. As will be apparent from FIG. 3, these pilot holes 6 are to become datum reference points for respective islands 15 on which semiconductor chips are to be mounted and for inner leads 16. Each pilot hole 6 is set to be aligned in the lateral or transverse direction with the center of a respective island 15, and the pitch dimension between adjacent pilot holes 6 is set at a specific value E.

In FIG. 1, the position indicated by the arrow B is the terminal objective stopping position relative to the lead frame 1 for carrying out wire bonding. A fiber sensor 7 for detecting the passage of diametrically opposite (downstream and upstream) parts of the rim of each passing pilot hole 6 is disposed on one side of the lead frame 1, in the path of the pilot holes 6, at a point at a distance (C+D) equal to distance C plus distance D upstream, or in the direction opposite to the arrow direction A, from the stopping position B. This fiber sensor 7 is functionally connected to a passage detection component 8, and when it detects the passage of the downstream part of the rim of a pilot hole 6, a passage detection signal Q is transmitted from the passage detection component 8 to a position pulse counter 11.

The aforementioned driving motor 4 with an encoder is activated by an input signal from a feed quantity control component 9 to rotate at a velocity v through only a specific rotational angle. The output from the encoder is aligned in a pulse train P corresponding to the frame feed quantity by a feed position pulse generating component 10 and is sent to the position pulse counter 11.

To the above mentioned feed quantity control component 9 is connected an initial feed quantity setting component 12, which inputs into the feed quantity control component 9 a feed quantity of a distance of frame feed quantity E-C which is less than the aforementioned specific pitch E by the above mentioned distance C. This initial feed time T comprises an acceleration time $t_1$, a constant velocity time $t_2$, and a deceleration time $t_3$. At the maximum velocity $V_{max}$, the driving motor 4 is activated, and, at the instant when the pilot hole 6 reaches a point which is in front of the stopping position B by the distance C, the motor 4 stops once, and the lead frame 1 stops.

During the above described process, the position pulse counter 11 counts the number of pulses of a pulse train $P_1$ corresponding to the feed quantity up to the stopping of the driving of the motor 4 from the timing resulting from inversion of a passage detection signal S from the passage detection component 8, which has detected the other (upstream) part of the rim of the pilot hole 6. In addition, this position pulse counter 11 counts the number of pulses of a pulse train $P_2$ also similarly from the timing after this time $t_P$ in which the detection signal S is inverted until the motor 4 stops.

This time $t_P$ is the time required for one pilot hole 6 to travel past a detection point above the aforementioned fiber sensor 7 and varies with the feeding speed, the size of the pilot hole 6, the position of the pilot hole 6, and other factors, and, as a consequence of this variation, the above mentioned numbers of pulses in the pulse trains also vary.

The values of the products obtained by multiplying the numbers of pulses $P_1$ and $P_2$ of the pulse trains thus counted by the position pulse counter 11 by the feeding quantity per pulse correspond to the distances the pilot hole 6 travels past the fiber sensor 7 from the time when the signal S of the passage detection component 8 is first inverted and the time when it is again inverted, and the value $(P_1+P_2)/2$ becomes the number of pulses corresponding to the distance D which the center of the pilot hole 6 has traveled past the fiber sensor 7. The product value obtained by multiplying this number of pulses by the above mentioned feeding quantity per pulse becomes the distance D, and the time required for this becomes $\Delta t$.

By maintaining the value of the distance $C+D$ constant, positioning is accomplished with good reproducibility at the ultimate objective stopping position B. By arbitrarily setting the distance C through the initial feeding quantity setting component 12, an ultimate objective stopping position B can be appropriately set to suit the character of the article being processed and the apparatus.

In carrying out in continuation the feeding of the lead frame 1 through the distance C, the distance D is estimated and set beforehand by an error computing component 13. By determining the difference of error between this preestimated distance D and the distance determined from the number of pulses $(P_1+P_2)/2$ mentioned hereinabove, the error difference $\pm \Delta D$ of distance corresponding to this difference of error is determined indirectly. Then, in an additional feed quantity setting component 14, the number of pulses resulting from the addition of this error difference $\pm \Delta D$ to the distance C is calculated, and feeding through a distance $C \pm \Delta D$ corresponding to this number of pulses thus calculated is carried out, the conveying of the lead frame 1 of the feed quantity $C \pm \Delta D$ being carried out over the additional feed time $t_4$, whereby the accurate and positive positioning is completed.

In the instant example, with the use of an encoder corresponding to 10 $\mu$m/pulse, conveying positioning is carried out at a pulse frequency of maximum velocity 25 KHz, and, with a required time held within 0.4 sec., the conveying positioning of the lead frame 1 can be accomplished accurately and positively even in the case where errors exist in the size and positional dimension H of the pilot hole 6, the width G of the lead frame 1, and the specific pitch E.

In this connection, a system wherein the lead frame 1 is provided, in addition to the pilot holes 6, with square holes 17, for example, which pass over the sensor 7 to cause the detection signal S to be outputted is also conceivable. In this case, however, the time interval T or the frame feed quantity can be limited so that only the pilot holes 6 will be detected, whereby the detection signal S will be received during only a restricted period thereby to solve this problem.

Figure 4:
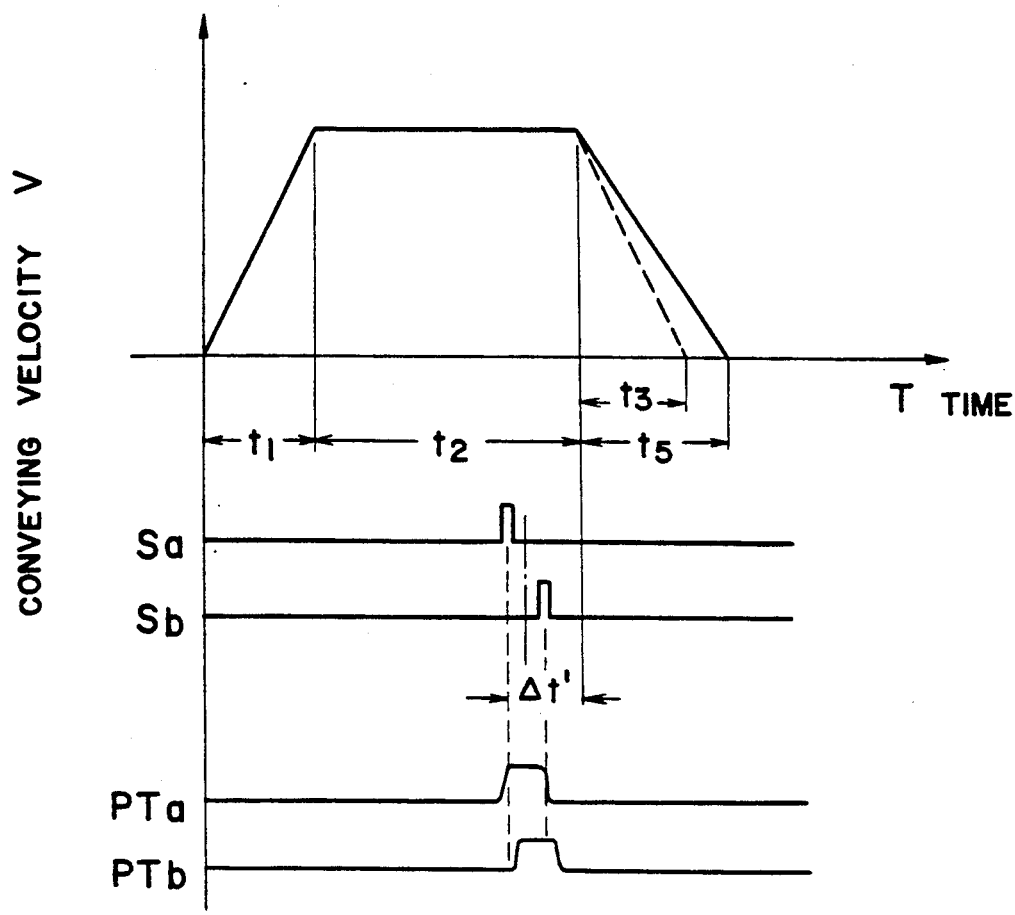
FIG. 4 is a time chart indicating the operation of another embodiment of the invention.

The time chart of another embodiment of this invention is shown in FIG. 4. This embodiment is an example in which the lead frame is not stopped until the pertinent pilot hole 6 reaches the objective stopping position. In this example, a conveyance direction two-lens sensor is used for the fiber sensor for detection, and the deviation outputs Sa and Sb wherein the output difference between the phototransistor outputs PTa and PTb of this sensor is a maximum are used as detection signals of the passage detecting component. In general, for reasons of noise resistance, modulated light is used, and, because of restriction of the modulation frequency thereof, there is a limit to the response speed, but a two-lens sensor of deviation output can follow an even higher speed conveyance because modulated light is unnecessary, which is convenient.

In FIG. 4, the number of pulses from the start of the driving motor to the instant the sensor detects the downstream part of the rim of a pilot hole 6 is designated by Pa, and the number of pulses to the instant when the succeeding (upstream) part of the rim is detected in designated by Pb. Then, the number of pulses up to the center of the pilot hole 6 is equal to $Pa+(Pb-Pa)/2$. Therefore, by multiplying the number of pulses up to the center of the pilot hole 6 by the distance per pulse to determine the distance up to the center of the pilot hole, and supplying the number of pulses corresponding to the distance from this center to the objective stopping position to the feed quantity controlling component 9, the center of the pilot hole 6 can be set at the objective stopping position.

Positioning is accomplished by conveying the frame through a specific frame feed quantity from the timing of the signals Sa and Sb, and, by increasing/decreasing the feed quantity in the deceleration time $t_3$ after the time $t_2$ in which the frame is conveyed at maximum velocity, variations of the time interval $\Delta t'$ from the midpoint of the signals Sa and Sb to the instant of completion of the maximum velocity period are disposed of. That is, by the increasing/decreasing of the frame feed quantity, with the timing of the signals Sa and Sb, the feed quantity thereafter is reset and reduced by the feed position pulses after the timing of the signals Sa and Sb, and the feed quantity is determined by the deceleration time of $t_3$ to $t_5$ by the number of remaining pulses at the instant of completion of the time interval $t_2$.

In the above described example, a conveying method utilizing rollers and an encoder is adopted, but this invention can be applied to other arrangements such as a combination of a reciprocating frame clamp and a pulse motor. Furthermore, for the sensor, the application of a laser sensor can be considered, and also a CCD line sensor can be applied. In addition, suitable detectable parts other than pilot holes may be used for detection.

Figure 5:
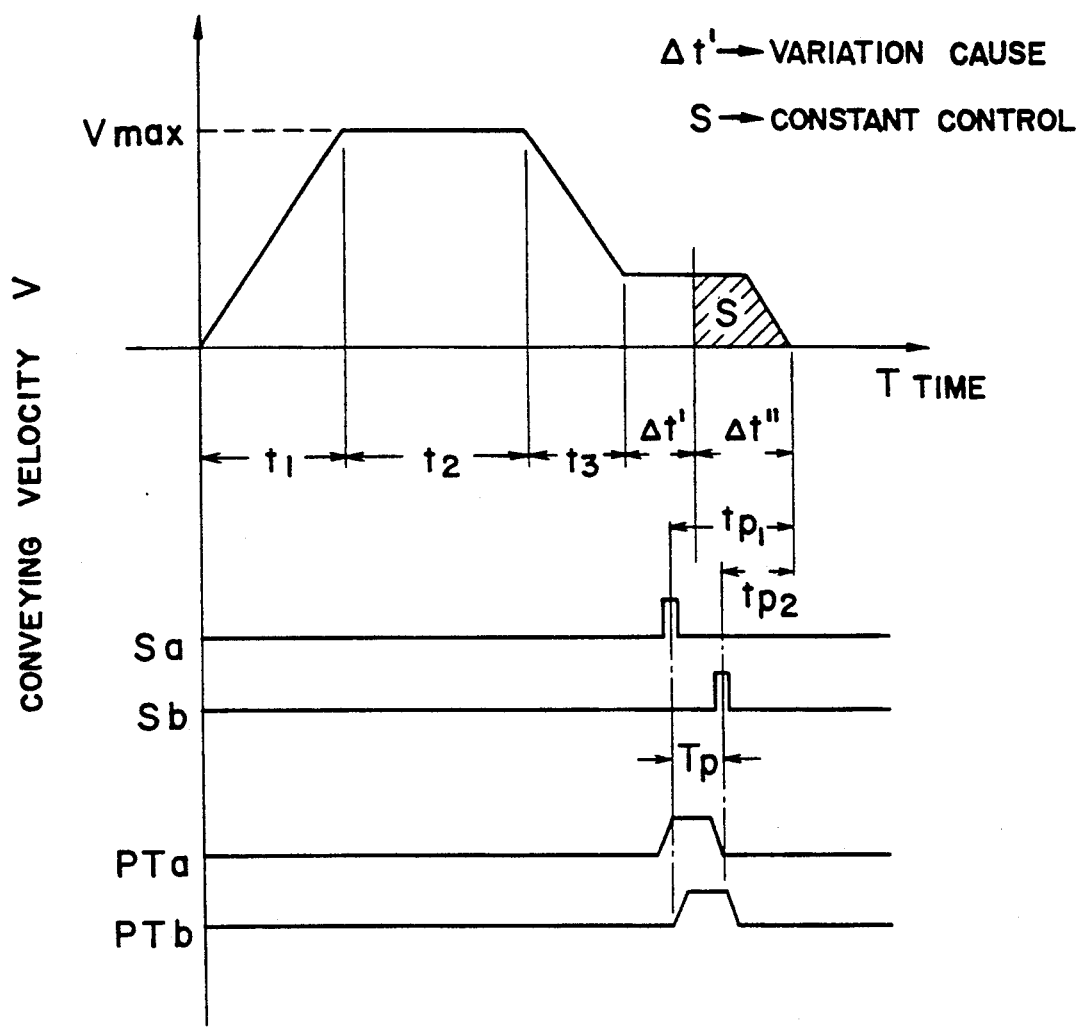
FIG. 5 is a time chart indicating the operation of still another embodiment of the invention.

Still another embodiment of this invention is indicated in FIG. 5 and illustrates an example wherein, in the case where, in the system indicated in FIG. 4, the conveying velocity $V_{max}$ of the lead frame is excessively high, and the sensor 7 cannot adequately follow the frame, the conveying velocity of the lead frame is reduced stepwise, and, in a low-velocity region, passage of the pilot holes is detected.

According to this invention, an area S in FIG. 5 which correspond to the distance C is controlled at constant value.

What is claimed is:

1. A system for feeding and positioning an article, the system comprising:
   a conveying device for driving and conveying said article, said article having a fixed reference in the form of a pilot hole and said conveying device temporarily stopping said article such that said reference is positioned in front of an ultimate objective stopping position;
   a passage detecting component, located at a forward mark point which has been set at a position at a specific distance in front of said ultimate objective stopping position, for detecting passage of said reference;

a position pulse counter for counting a first number of pulses corresponding to a time period between passage of one rim of said pilot hole and said temporary stopping of said article and a second number of pulses corresponding to a time period between passage of an opposite rim of said pilot hole and said temporary stopping of said article, and for determining a distance between a center of said pilot hole of said article temporarily stopped and said forward mark point in accordance with said first and second numbers of pulses;

an initial feed quantity setting component for setting an initial feeding quantity of said article at less than a predetermined pitch and at more than said pitch minus said specific distance;

an additional feed quantity setting component for setting an additional feeding quantity of said article up to said ultimate objective stopping position which is calculated in accordance with said distance between said center of said pilot hole and said forward mark point determined in said position pulse counter; and a feed quantity control component for controlling a driving quantity of said conveying device in accordance with said quantities of feeding thus set.

2. A system as claimed in claim 1 wherein said additional feed quantity setting component includes means for generating a number of pulses corresponding to a distance between said center of said pilot hole and said ultimate objective stopping position.

3. A system as claimed in claim 2 wherein said additional feeding quantity is non-negative.

4. A system as claimed in claim 1 in which said position pulse counter includes means for counting a plurality of pulses corresponding to the opposite rim of a pilot hole formed in an article and calculates the number of pulses corresponding to the size of the pilot hole of the article.

5. A system as claimed in claim 1 wherein said passage detecting component includes a unit which permits passage detecting component operation only in a limited range with respect to a feed quantity of each article.

6. A system as claimed in claim 1 wherein said additional feeding quantity is said specific distance minus said distance between said center of said pilot hole and said forward mark point.

* * * * *